(12) United States Patent
Chen et al.

(10) Patent No.: US 10,739,388 B2
(45) Date of Patent: Aug. 11, 2020

(54) HARMONIC DISTORTION SEPARATION METHOD, NONLINEAR CHARACTER DETERMINATION METHOD AND APPARATUS AND SYSTEM

(71) Applicant: FUJITSU LIMITED, Kawasaki (JP)

(72) Inventors: Hao Chen, Beijing (CN); Zhenning Tao, Beijing (CN)

(73) Assignee: FUJITSU LIMITED, Kawasaki (JP)

( * ) Notice: Subject to any disclaimer, the term of this patent is extended or adjusted under 35 U.S.C. 154(b) by 175 days.

(21) Appl. No.: 15/425,392

(22) Filed: Feb. 6, 2017

(65) Prior Publication Data

US 2017/0227585 A1  Aug. 10, 2017

(30) Foreign Application Priority Data

Feb. 6, 2016  (CN) .......................... 2016 1 0083856

(51) Int. Cl.
*G01R 23/20* (2006.01)
*G01R 23/02* (2006.01)
(Continued)

(52) U.S. Cl.
CPC ........... *G01R 25/005* (2013.01); *G01R 23/20* (2013.01); *G01R 23/005* (2013.01); *G01R 23/02* (2013.01);
(Continued)

(58) Field of Classification Search
CPC ...... G01R 23/20; G01R 23/02; G01R 23/005; G01R 25/005; G01R 31/3167; H04B 17/0085; H04B 17/12
See application file for complete search history.

(56) References Cited

U.S. PATENT DOCUMENTS

| | | | | |
|---|---|---|---|---|
| 7,561,857 B2* | 7/2009 | Singerl | ................. | H03F 1/3258 330/149 |
| 7,583,754 B2* | 9/2009 | Liu | ........................ | H03F 1/3247 375/278 |
| 8,400,338 B2* | 3/2013 | O'Brien | ............. | G01D 5/24452 341/118 |

FOREIGN PATENT DOCUMENTS

CN     103901273     7/2014

OTHER PUBLICATIONS

Fedorenko, Phase Distortion in Envelope Elimination and Restoration radio Frequency Power Amplifiers, 2009.*
(Continued)

*Primary Examiner* — Gregory J Toatley, Jr.
*Assistant Examiner* — Lynda Dinh
(74) *Attorney, Agent, or Firm* — Staas & Halsey LLP

(57) ABSTRACT

A harmonic distortion separation method, nonlinear character determination method, apparatus and system where a phase difference between an inherent harmonic and a generated harmonic is determined by using multiple groups of input power, output power and fundamental magnitudes of a memoryless nonlinear transfer function of a nonlinear model of a system to be measured, and power of a harmonic generated by the system to be measured is separated by using the phase difference. In an embodiment, the phase difference between the inherent harmonic and the generated harmonic is first determined by using an assumption that a model coefficient is a constant according to the set nonlinear model, then the harmonic separation is performed by using the phase difference, and the power of the harmonic generated by the system to be measured is calculated.

16 Claims, 9 Drawing Sheets

(51) Int. Cl.
  *G01R 25/00*   (2006.01)
  *G01R 31/3167*   (2006.01)
  *G01R 23/00*   (2006.01)
  *H04B 17/00*   (2015.01)
  *H04B 17/12*   (2015.01)

(52) U.S. Cl.
  CPC ...... *G01R 31/3167* (2013.01); *H04B 17/0085* (2013.01); *H04B 17/12* (2015.01)

(56) References Cited

OTHER PUBLICATIONS

Dobucki, Nonlinear Distortions in Electroacoustic Devices, 2011.*
Chinese Office Action dated Dec. 18, 2019 in Chinese Patent Application No. 201610083856.9.
Pavlo Fedorenko, "Phase Distortion in Envelope Elimination and Restoration Radio Frequency Power Amplifiers", A Thesis Presented to the Academic Faculty, Georgia Institute of Technology, Aug. 2009, 117 pages.

\* cited by examiner

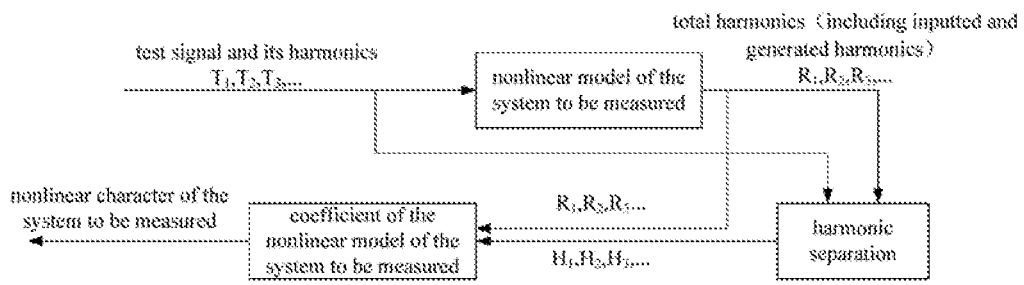

FIG. 1

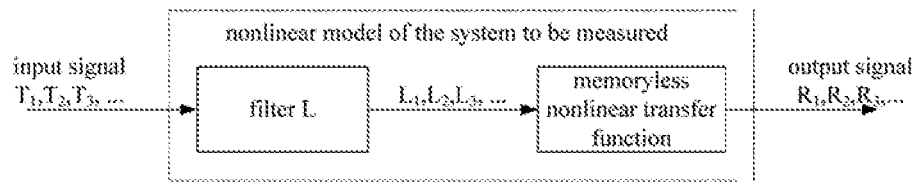

FIG. 2

301 a phase difference between an inherent harmonic and a generated harmonic is determined by using multiple group of input power, output power and fundamental magnitudes of a memoryless nonlinear transfer function of a nonlinear model of a system to be measured

302 power of a harmonic generated by the system to be measured is separated by using the phase difference

FIG. 3

HARMONIC DISTORTION SEPARATION METHOD, NONLINEAR CHARACTER DETERMINATION METHOD AND APPARATUS AND SYSTEM

CROSS-REFERENCE TO RELATED APPLICATIONS

This application claims the priority benefit of Chinese Patent Application No. 201610083856.9, filed on Feb. 6, 2016 in the Chinese Intellectual Property Office, the disclosure of which is incorporated herein in its entirety by reference.

BACKGROUND

1. Field

This disclosure relates to the field of communications, and in particular to a harmonic distortion separation method, nonlinear character determination method and apparatus and a system.

2. Description of the Related Art

As continuous increase of a transmission rate of a communication system, a nonlinear character in the system becomes one of factors limiting the performance, therefore, much attention is paid to it. In various methods of dealing with a nonlinear character of a system, a necessary premise step is measuring and estimating the nonlinear character.

Currently, a commonly-used method is to first measure a nonlinear harmonic of a system to be measured or a device to be measured, then either directly use harmonic power to feature a nonlinear character (THD (total harmonics distortion) index of a device), or create a nonlinearity model, calculate a model coefficient according to the harmonic power, and determine the nonlinear character by using the model. Its advantage is being simple in measuring and wide in applicability. However, a problem exists in these methods that when a harmonic is measured, if a test signal inputted to the system to be measured or the device to be measured itself has a relatively large harmonic component (which is inevitable in measurement), a relatively large error will exist in the measured harmonic power.

It should be noted that the above description of the background is merely provided for clear and complete explanation of this disclosure and for easy understanding by those skilled in the art. And it should not be understood that the above technical solution is known to those skilled in the art as it is described in the background of this disclosure.

SUMMARY

In the implementation of this disclosure, it was found by the inventors that in the existing methods, as a phase relationship between an inherent harmonic (of the test signal itself) and a generated harmonic (generated by the system to be measured or the device to be measured) is unknown, such an error is simply neglected, and a method for increasing a tolerance of subsequent operation is used to deal with influence brought by such a measurement error. Its defect is obvious, that is, efficiency and performance of the subsequent operations are sacrificed.

In order to solve the above problem, embodiments of this disclosure provide a harmonic distortion separation method, nonlinear character determination method and apparatus and a system.

According to a first aspect of the embodiments of this disclosure, there is provided a harmonic distortion separation method, including: a phase difference between an inherent harmonic and a generated harmonic is determined by using multiple groups of input power, output power and fundamental magnitudes of a memoryless nonlinear transfer function of a nonlinear model of a system to be measured; and power of a harmonic generated by the system to be measured is separated by using the phase difference.

According to a second aspect of the embodiments of this disclosure, there is provided a nonlinear character determination method, including a phase difference between an inherent harmonic and a generated harmonic is determined by using multiple groups of input power, output power and fundamental magnitudes of a memoryless nonlinear transfer function of a nonlinear model of a system to be measured; power of a harmonic generated by the system to be measured is separated by using the phase difference; and a nonlinear character of the system to be measured is determined by using the separated power of the harmonic generated by the system to be measured.

According to a third aspect of the embodiments of this disclosure, there is provided a harmonic distortion separation apparatus, configured in a transmitter or a receiver or a communication system, the apparatus including a determining unit configured to determine a phase difference between an inherent harmonic and a generated harmonic by using multiple groups of input power, output power and fundamental magnitudes of a memoryless nonlinear transfer function of a nonlinear model of a system to be measured; and a separating unit configured to separate power of a harmonic generated by the system to be measured by using the phase difference.

According to a fourth aspect of the embodiments of this disclosure, there is provided a nonlinear character determination apparatus, configured in a transmitter or a receiver or a communication system, the apparatus including a first determining unit configured to determine a phase difference between an inherent harmonic and a generated harmonic by using multiple groups of input power, output power and fundamental magnitudes of a memoryless nonlinear transfer function of a nonlinear model of a system to be measured; a separating unit configured to separate power of a harmonic generated by the system to be measured by using the phase difference; and a second determining unit configured to determine a nonlinear character of the system to be measured by using the separated power of the harmonic generated by the system to be measured.

According to a fifth aspect of the embodiments of this disclosure, there is provided a transmitter, including the apparatus as described in the third or the fourth aspect.

According to a sixth aspect of the embodiments of this disclosure, there is provided a receiver, including the apparatus as described in the third or the fourth aspect.

According to a seventh aspect of the embodiments of this disclosure, there is provided a communication system, including a transmitter and a receiver, and further including the apparatus as described in the third or the fourth aspect.

An advantage of the embodiments of this disclosure exists in that with the embodiments of this disclosure, the inherent harmonic of the test signal itself may be removed, and the power of the harmonic generated by the system to be measured or the device to be measured may be separated, thereby increasing accuracy of nonlinear measurement, and improving performance of the system.

With reference to the following description and drawings, the particular embodiments of this disclosure are disclosed in detail, and the principles of this disclosure and the manners of use are indicated. It should be understood that the scope of the embodiments of this disclosure is not limited thereto. The embodiments of this disclosure contain many alternations, modifications and equivalents within scope of the terms of the appended claims.

Features that are described and/or illustrated with respect to one embodiment may be used in the same way or in a similar way in one or more other embodiments and/or in combination with or instead of the features of the other embodiments.

It should be emphasized that the term "comprises/comprising/includes/including" when used in this specification is taken to specify the presence of stated features, integers, steps or components but does not preclude the presence or addition of one or more other features, integers, steps, components or groups thereof.

Additional aspects and/or advantages will be set forth in part in the description which follows and, in part, will be apparent from the description, or may be learned by practice of the invention.

BRIEF DESCRIPTION OF THE DRAWINGS

Elements and features depicted in one drawing or embodiment of the disclosure may be combined with elements and features depicted in one or more additional drawings or embodiments. Moreover, in the drawings, like reference numerals designate corresponding parts throughout the several views and may be used to designate like or similar parts in more than one embodiment.

The drawings are included to provide further understanding of the present disclosure, which constitute a part of the specification and illustrate the exemplary embodiments of the present disclosure, and are used for setting forth the principles of the present disclosure together with the description. It is clear and understood that the accompanying drawings in the following description are some embodiments of the present disclosure, and for those of ordinary skills in the art, other accompanying drawings may be obtained according to these accompanying drawings without making an inventive effort. In the drawings:

FIG. 1 is a schematic diagram of the principles of this disclosure;

FIG. 2 is a schematic diagram of a nonlinear model of the system to be measured of this disclosure;

FIG. 3 is a flowchart of the harmonic distortion separation method of an embodiment of this disclosure;

DETAILED DESCRIPTION

Figure 4:
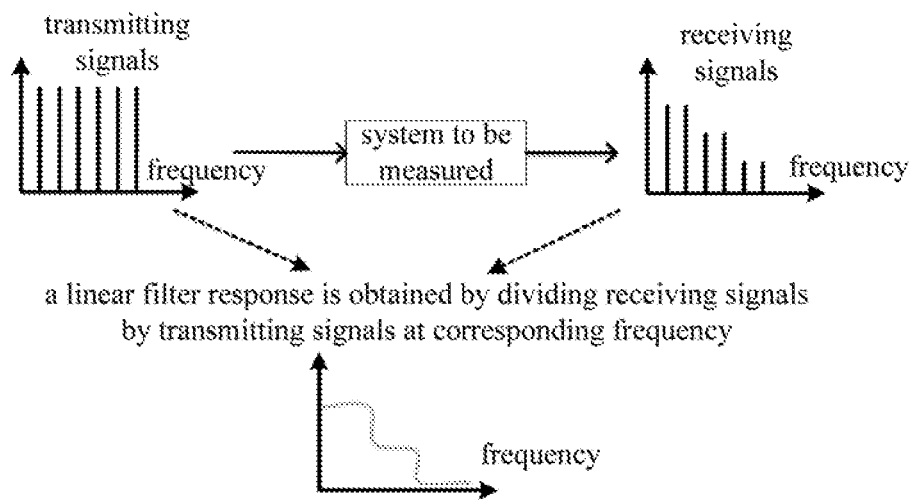
FIG. 4 is a schematic diagram of a linear filter response of the system to be measured.

These and further aspects and features of the present disclosure will be apparent with reference to the following description and attached drawings. In the description and drawings, particular embodiments of the disclosure have been disclosed in detail as being indicative of some of the ways in which the principles of the disclosure may be employed, but it is understood that the disclosure is not limited correspondingly in scope. Rather, the disclosure includes all changes, modifications and equivalents coming within terms of the appended claims. Various embodiments of the present disclosure shall be described below with reference to the accompanying drawings.

The embodiments of this disclosure provide a harmonic distortion separation method, nonlinear character determination method and apparatus and a system, in which a phase difference between the inherent harmonic and the generated harmonic is first determined by using an assumption that a model coefficient is a constant according to the set nonlinear model, then the harmonic separation is performed by using the phase difference, and the power of the harmonic generated by the system to be measured or the device to be measured is calculated. Hence, accuracy of nonlinear measurement may be increased, and performance of the system may be improved. Here, the system to be measured or the device to be measured is, for example, an amplifier in the communication system, or a demodulator in the transmitter, etc. For the sake of description, the system to be measured and the device to be measured are collectively referred to as a system to be measured.

Various implementations of this disclosure shall be described below with reference to the drawings. These implementations are illustrative only, and are not intended to limit this disclosure.

FIG. 1 is a schematic diagram of the principles of this embodiment. As shown in FIG. 1, $\{T_1, T_2, T_3, \ldots\}$, $\{R_1, R_2, R_3, \ldots\}$ and $\{H_1, H_2, H_3, \ldots\}$ denote power of a fundamental wave, a secondary harmonic, and a third harmonic, etc., of a signal. For example, $\{T_1, T_2, T_3, \ldots\}$ denotes power of a fundamental wave, power of a secondary harmonic, and power of a third harmonic, etc., of a test signal (an input signal), $\{R_1, R_2, R_3, \ldots\}$ denotes power of a fundamental wave, power of a secondary harmonic, and power of a third harmonic, etc., of an output signal, and $\{H_1, H_2, H_3, \ldots\}$ denotes power of a fundamental wave, power of a secondary harmonic, and power of a third harmonic, etc., of a signal generated by the system to be measured after harmonic separation. In the prior art, output power $\{R_1, R_2, R_3, \ldots\}$ (shown in a dotted line in FIG. 1) of a nonlinear model of the system to be measured is only used to determine a coefficient of the nonlinear model of the system to be measured, so as to obtain a nonlinear character of the system to be measured. In this disclosure, power of the harmonic generated by the system to be measured is separated by using the input power and the output power of the nonlinear model of the system to be measured, so as to determine the coefficient of the nonlinear model of the system to be measured, thereby obtaining the nonlinear character of the system to be measured.

FIG. 2 is a schematic diagram of the nonlinear model of the system to be measured of the present embodiment. In this embodiment, a Wiener model is taken as an example. However, this embodiment is not limited thereto, and other types of nonlinear models are also applicable to this disclosure, such as a Hammerstein model, etc. As shown in FIG. 2, similar to FIG. 1, $\{T_1, T_2, T_3, \ldots\}$, $\{R_1, R_2, R_3, \ldots\}$ and $\{H_1, H_2, H_3, \ldots\}$ denote power of a fundamental wave, a secondary harmonic, and a third harmonic, etc., of a signal.

Embodiment 1

This embodiment provides a harmonic distortion separation method. FIG. 3 is a schematic diagram of this method. As shown in FIG. 3, the method includes step (operation) 301: a phase difference between an inherent harmonic and a generated harmonic is determined by using multiple groups of input power, output power and fundamental magnitudes of a memoryless nonlinear transfer function of a nonlinear model of a system to be measured.

As shown in FIG. 3, the method includes step 302: power of a harmonic generated by the system to be measured is separated by using the phase difference.

In this embodiment, a linear filter response of the system to be measured may be measured first, such as by transmitting sinusoidal signals (test signals) of multiple frequencies. As shown in FIG. 4, a measurement method is not limited in this embodiment.

Then, power of the test signals are changed, and multiple groups of power of input harmonics (briefly referred to as input power) and power of output harmonics (briefly referred to as output power) of the system to be measured, such as $\{T_1, T_2, T_3, \ldots\}$ and $\{R_1, R_2, R_3, \ldots\}$ shown in FIG. 2, are measured. Here, the test signals are, for example, noise-like signals; however, a measurement method is not limited in this embodiment. Furthermore, a group of measurement results refers to $\{T_1, T_2, T_3, \ldots\}$ and $\{R_1, R_2, R_3, \ldots\}$ obtained corresponding to one power of test signals, and multiple groups of measurement results refer to $\{T_1, T_2, T_3, \ldots\}$ and $\{R_1, R_2, R_3, \ldots\}$ obtained corresponding to multiple power of test signals.

Thereafter, multiple groups of input power and output power of the memoryless nonlinear transfer function of the nonlinear model, such as $\{L_1, L_2, L_3, \ldots\}$ and $\{R_1, R_2, R_3, \ldots\}$ shown in FIG. 2, are obtained according to the set nonlinear model of the system to be measured by using the measured input power and output power and said linear filter response; wherein, $\{L_1, L_2, L_3, \ldots\}$ is obtained by $\{T_1, T_2, T_3, \ldots\}$ passing a measured linear filter, and $\{R_1, R_2, R_3, \ldots\}$ is directly obtained by the nonlinear model of the system to be measured.

In this embodiment, for a fundamental wave, fundamental power $H_1$ may be calculated and separated by using the output fundamental wave $R_1$, for example, $H_1=R_1$. And a fundamental magnitude A may be obtained through calculating by using the separated fundamental power $H_1$, for example, $A=\sqrt{2H_1}$.

In this embodiment, after the multiple groups of input power, output power and the fundamental magnitudes of the memoryless nonlinear transfer function of the nonlinear model of the system to be measured are obtained, the phase difference between the inherent harmonic and the generated harmonic may be determined. A determination method is not limited in this embodiment, and shall be described below with reference to several implementations. However, it is understood by those skilled in the art that any method for determining a phase difference between an inherent harmonic and a generated harmonic by using multiple groups of input power, output power and fundamental magnitudes of a memoryless nonlinear transfer function of a nonlinear model of a system to be measured is covered by the protection scope of this disclosure.

In this embodiment, for a secondary harmonic, a phase difference $\Delta\varphi_2$ between an inherent harmonic and a generated harmonic may be determined by using each group of the input power $L_2$, the output power $R_2$ and the fundamental magnitude A of the memoryless nonlinear transfer function. For example, the phase difference $\Delta\varphi_2$ may be determined by using the following formula:

$$\sqrt{R_2 - L_2\sin^2\Delta\varphi_2} - \sqrt{L_2}\cos\Delta\varphi_2 = \frac{\sqrt{2}}{4}|c_2|A^2.$$

In the above formula, $R_2$ is output power of the memoryless nonlinear transfer function corresponding to the secondary harmonic, $L_2$ is input power of the memoryless nonlinear transfer function corresponding to the secondary harmonic, A is a fundamental magnitude, and $c_2$ is a coefficient of the nonlinear model corresponding to the secondary harmonic, which is assumed as being a constant.

In this embodiment, determining the phase difference $\Delta\varphi_2$ is selecting a value of $\Delta\varphi_2$, which makes $\sqrt{R_2-L_2\sin^2\Delta\varphi_2}-\sqrt{L_2}\cos\Delta\varphi_2$ and $$\frac{\sqrt{2}}{4}A^2$$

in the above formula to present a relatively good linear relationship.

In an implementation, multiple angles $\Delta\varphi_2$ may be selected from a range of 0-$2\pi$ first, then linear fitting is performed on $\sqrt{R_2-L_2\sin^2\Delta\varphi_2}-\sqrt{L_2}\cos\Delta\varphi_2$ and $$\frac{\sqrt{2}}{4}A^2$$

in the above formula by using each of $\Delta\varphi_2$, and a $\Delta\varphi_2$ making a fitting correlation coefficient maximum is selected as the phase difference corresponding to the secondary harmonic.

In another implementation, multiple angles $\Delta\varphi_2$ may be selected from a range of 0-$2\pi$ first, then division operations are performed on $\sqrt{R_2-L_2\sin^2\Delta\varphi_2}-\sqrt{L_2}\cos\Delta\varphi_2$ and $$\frac{\sqrt{2}}{4}A^2$$

by using each of $\Delta\varphi_2$, and a $\Delta\varphi_2$ making variance of quotients minimum is selected as the phase difference corresponding to the secondary harmonic.

In this implementation, the above angles may be selected as per a predetermined step, or may be selected randomly, or may be selected according to other policies, and this embodiment is not limited thereto. With this implementation, the phase difference $\Delta\varphi_2$ between the inherent harmonic and the generated harmonic corresponding to the secondary harmonic may be obtained, thereby separating the power $H_2$ of the secondary harmonic generated by the system to be measured.

In an implementation, the power $H_2$ of the secondary harmonic generated by the system to be measured may be separated by using the following formula:

$$H_2 = (\sqrt{R_2 - L_2 \sin^2 \Delta\varphi_2} - \sqrt{L_2} \cos \Delta\varphi_2)^2.$$

In this formula, meanings of the letters are as those described above, and shall not be described herein any further.

In this embodiment, for a third harmonic, a method is similar to that for the secondary harmonic, in which a phase difference $\Delta\varphi_3$ between an inherent harmonic and a generated harmonic may be determined by using each group of the input power $L_3$, the output power $R_3$ and the fundamental magnitude A of the memoryless nonlinear transfer function. For example, the phase difference $\Delta\varphi_3$ may be determined by using the following formula:

$$\sqrt{R_3 - L_3 \sin^2 \varphi_3} - \sqrt{L_3} \cos\Delta\varphi_3 = \frac{\sqrt{2}}{8} |c_3| A^3.$$

In the above formula, $R_3$ is output power of the memoryless nonlinear transfer function corresponding to the third harmonic, $L_3$ is input power of the memoryless nonlinear transfer function corresponding to the third harmonic, A is a fundamental magnitude, and $c_3$ is a coefficient of the nonlinear model corresponding to the third harmonic, which is assumed as being a constant.

In this embodiment, similar to the method for the secondary harmonic, in an implementation, multiple angles $\Delta\varphi_3$ may be selected from a range of $0\text{-}2\pi$, then linear fitting is performed on $\sqrt{R_3 - L_3 \sin^2 \Delta\varphi_3} - \sqrt{L_3} \cos \Delta\varphi_3$ and $$\frac{\sqrt{2}}{8} A^3$$

in the above formula by using each of $\Delta\varphi_3$, and a $\Delta\varphi_3$ making a fitting correlation coefficient maximum is selected as the phase difference corresponding to the third harmonic. In another implementation, multiple angles $\Delta\varphi_3$ may be selected from a range of $0\text{-}2\pi$, then division operations are performed on $\sqrt{R_3 - L_3 \sin^2 \Delta\varphi_3} - \sqrt{L_3} \cos \Delta\varphi_3$ and $$\frac{\sqrt{2}}{8} A^3$$

by using each of $\Delta\varphi_3$; and a $\Delta\varphi_3$ making variance of quotients minimum is selected as the phase difference between the inherent harmonic and the third harmonic. As described above, this embodiment is not limited to such a method. And, as described above, in this implementation, the above angles may be selected as per a predetermined step, or may be selected randomly, or may be selected according to other policies, and this embodiment is not limited thereto.

In this embodiment, after the phase difference $\Delta\varphi_3$ between the inherent harmonic and the generated harmonic corresponding to the third harmonic is obtained, power $H_3$ of the third harmonic generated by the system to be measured may be separated. For example, the power $H_3$ of the third harmonic generated by the system to be measured may be separated by using the following formula:

$$H_3 = (\sqrt{R_3 - L_3 \sin^2 \Delta\varphi_3} - \sqrt{L_3} \cos \Delta\varphi_3)^3.$$

In this formula, meanings of the letters are as those described above, and shall not be described herein any further.

Harmonic separation of this embodiment is described above with reference to the secondary harmonic and the third harmonic. However, this embodiment is not limited thereto. In implementation, harmonic separation of higher harmonics may be performed by using the similar method on demand, so as to obtain separated harmonic power $\{H_1, H_2, H_3, \ldots\}$ generated by the system to be measured. Hence, the nonlinear character of the device to be measured may be obtained by using these harmonic power, and corresponding processing may be performed.

Figure 5:
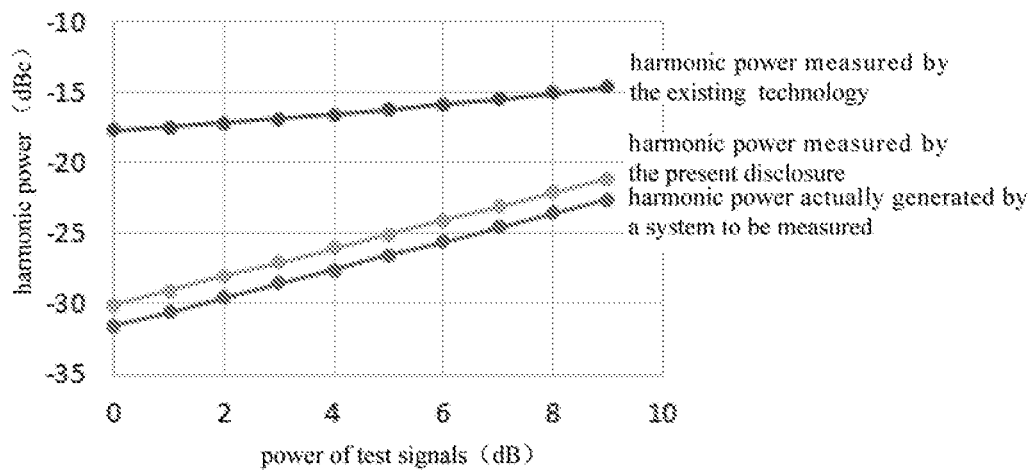
FIG. 5 is a schematic diagram of performance comparison.

FIG. 5 is a schematic diagram of performance testing for measuring the power of the secondary harmonic of the system to be measured. As shown in FIG. 5, if the method of this disclosure is used, the measured harmonic power is more accurate.

With the method of this embodiment, the power of the harmonic generated by the system to be measured may be separated, thereby making the nonlinear measurement relatively high in accuracy.

Embodiment 2

Figure 6:
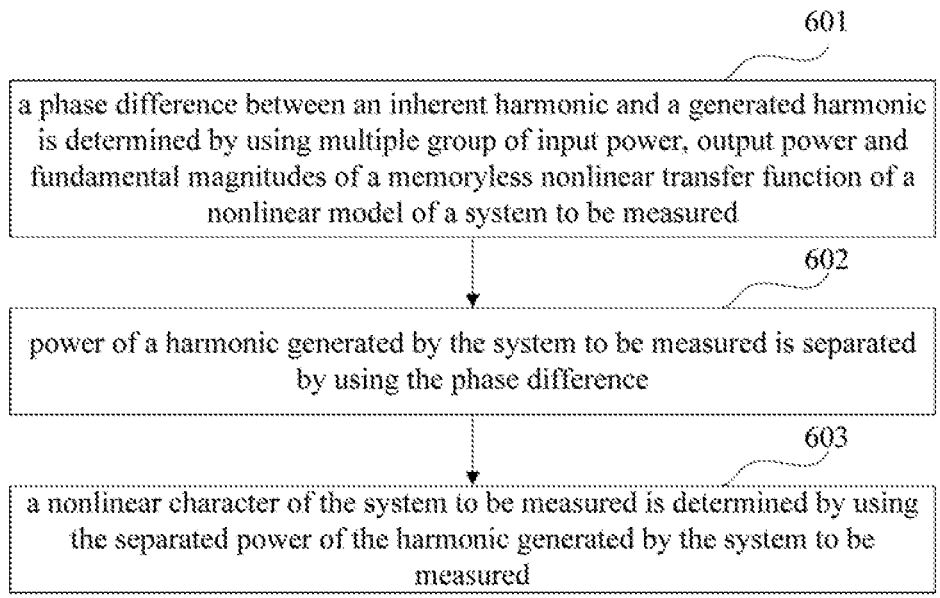
FIG. 6 is a flowchart of the nonlinear character determination method of the embodiment.

An embodiment of this disclosure further provides a nonlinear character determination method. FIG. 6 is a flowchart of the method. As shown in FIG. 6, the method includes step 601: a phase difference between an inherent harmonic and a generated harmonic is determined by using multiple groups of input power, output power and fundamental magnitudes of a memoryless nonlinear transfer function of a nonlinear model of a system to be measured.

As also shown in FIG. 6, the method includes step 602: power of a harmonic generated by the system to be measured is separated by using the phase difference; and step 603: a nonlinear character of the system to be measured is determined by using the separated power of the harmonic generated by the system to be measured.

In this embodiment, implementations of steps 601 and 602 are identical to those of steps 301 and 302 in Embodiment 1, the contents of which being incorporated herein, and being not going to be described herein any further.

In this embodiment, the nonlinear character of the system to be measured may be determined by using the separated power of the harmonic generated by the system to be measured. A determination method is not limited in this embodiment, and any implementable methods may be applicable to this disclosure.

With the method of this embodiment, the measurement of the nonlinear character may be performed by using the separated power of the harmonic generated by the system to be measured, which is relatively high in accuracy.

Embodiment 3

This embodiment provides a harmonic distortion separation apparatus, configured in a transmitter or a receiver or a communication system. As principles of the apparatus for solving problems are similar to that of the method in Embodiment 1, the implementation of the method in Embodiment 1 may be referred to for implementation of the apparatus, with identical contents being not going to be described herein any further.

Figure 7:
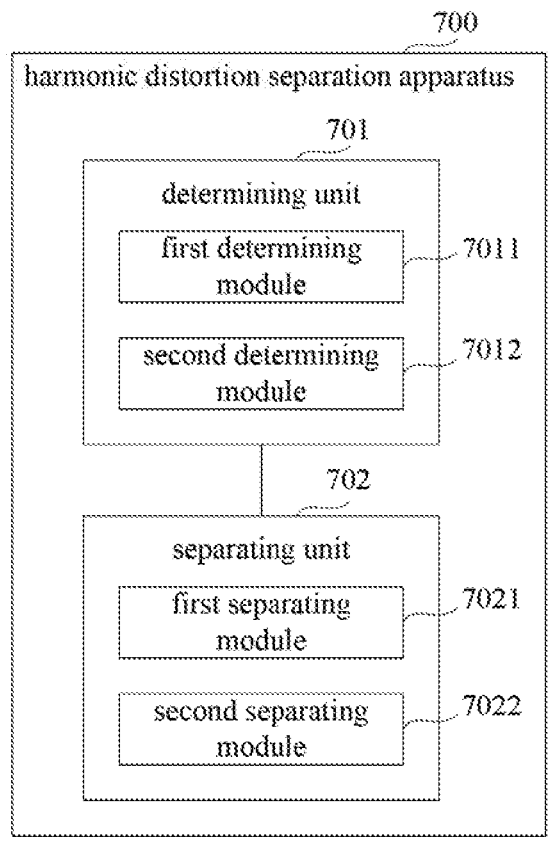
FIG. 7 is a schematic diagram of an implementation of the harmonic distortion separation apparatus of the embodiment.

FIG. 7 is a schematic diagram of the apparatus. As shown in FIG. 7, the apparatus 700 includes a determining unit 701 and a separating unit 702.

In this embodiment, the determining unit 701 determines a phase difference between an inherent harmonic and a generated harmonic by using multiple groups of input power, output power and fundamental magnitudes of a memoryless nonlinear transfer function of a nonlinear model of a system to be measured, and the separating unit 702 separates power of a harmonic generated by the system to be measured by using the phase difference.

In an implementation, as shown in FIG. 7, the determining unit 701 includes a first determining module 7011, which is configured to determine a phase difference $\Delta\varphi_2$ between an inherent harmonic and a generated harmonic corresponding to a secondary harmonic by using the following formula:

$$\sqrt{R_2 - L_2\sin^2\Delta\varphi_2} - \sqrt{L_2}\cos\Delta\varphi_3 = \frac{\sqrt{2}}{8}|c_2|A^2;$$

where, $R_2$ is output power of the memoryless nonlinear transfer function corresponding to the secondary harmonic, $L_2$ is input power of the memoryless nonlinear transfer function corresponding to the secondary harmonic, $A$ is a fundamental magnitude, and $c_2$ is a coefficient of the nonlinear model corresponding to the secondary harmonic, which is assumed as being a constant.

Figure 8:
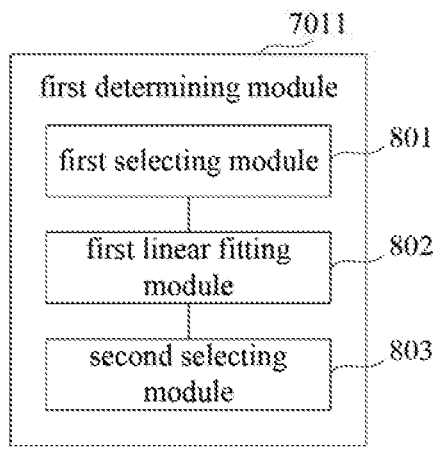
FIG. 8 is a schematic diagram of an implementation of the first determining module in the apparatus of FIG. 7.

In an implementation of the first determining module 7011, as shown in FIG. 8, the first determining module 7011 includes a first selecting module 801, a first linear fitting module 802 and a second selecting module 803. In this implementation, the first selecting module 801 may select multiple angles $\Delta\varphi_2$ from a range of 0-$2\pi$, with a selection method being not limited in this embodiment; the first linear fitting module 802 may perform linear fitting on $\sqrt{R_2-L_2\sin^2\Delta\varphi_2}-\sqrt{L_2}\cos\Delta\varphi_2$ and $$\frac{\sqrt{2}}{4}A^2$$

in the above formula by using each of $\Delta\varphi_2$; and the second selecting module 803 may select a $\Delta\varphi_2$ making a fitting correlation coefficient maximum as the phase difference corresponding to the secondary harmonic, with details being as those described above, and being not going to be described herein any further.

Figure 9:
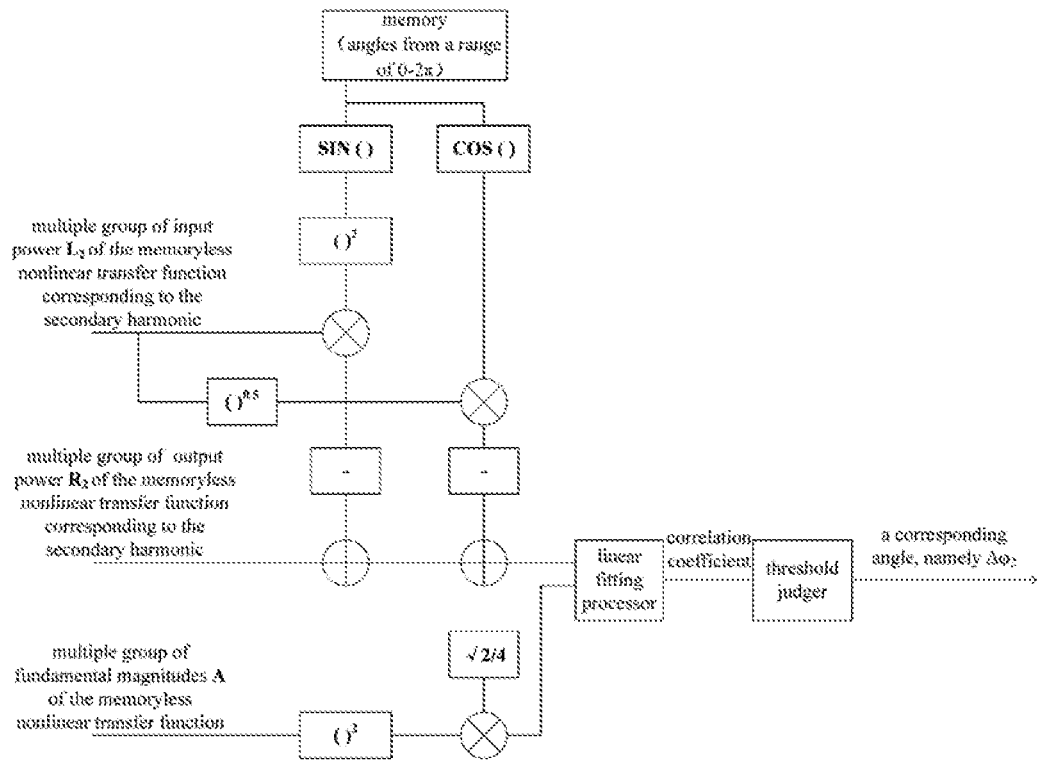
FIG. 9 is a schematic diagram of a hardware structure of the implementation of FIG. 8.

FIG. 9 is a schematic diagram of a hardware structure of the first determining module 7011 of the implementation. However, this implementation is not limited thereto, and the implementation may be carried out via software.

Figure 10:
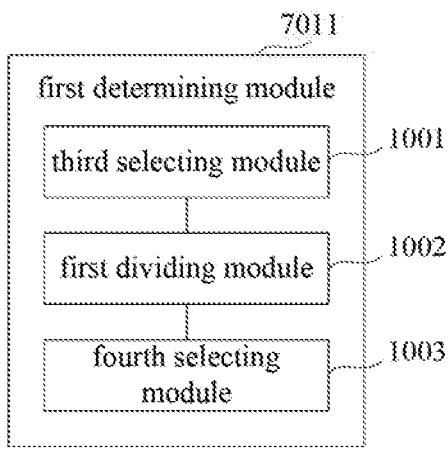
FIG. 10 is a schematic diagram of another implementation of the first determining module in the apparatus of FIG. 7.

In another implementation of the first determining module 7011, as shown in FIG. 10, the first determining module 7011 includes a third selecting module 1001, a first dividing module 1002 and a fourth selecting module 1003. In this implementation, the third selecting module 1001 may select multiple angles $\Delta\varphi_2$ from a range of 0-$2\pi$, with a selection method being not limited in this embodiment; the first dividing module 1002 may perform division operations on $\sqrt{R_2-L_2\sin^2\Delta\varphi_2}-\sqrt{L_2}\cos\Delta\varphi_2$ and $$\frac{\sqrt{2}}{4}A^2$$

by using each of $\Delta\varphi_2$; and the fourth selecting module 1003 may select a $\Delta\varphi_2$ making variance of quotients minimum as the phase difference corresponding to the secondary harmonic.

Figure 11:
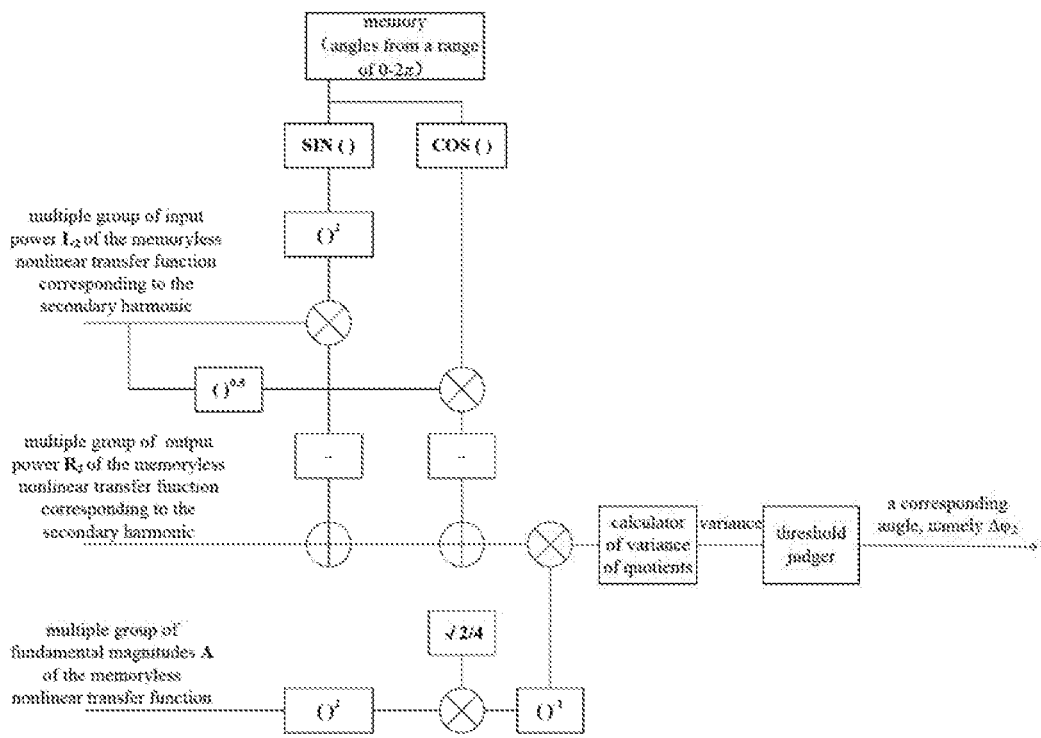
FIG. 11 is a schematic diagram of a hardware structure of the implementation of FIG. 10.

FIG. 11 is a schematic diagram of a hardware structure of the first determining module 7011 of the implementation. However, this implementation is not limited thereto, and the implementation may be carried out via software.

In this implementation, as shown in FIG. 7, the separating unit 702 includes a first separating module 7021, which is configured to separate power $H_2$ of the secondary harmonic generated by the system to be measured by using the following formula:

$$H_2 = (\sqrt{R_2-L_2\sin^2\Delta\varphi_2}-\sqrt{L_2}\cos\Delta\varphi_2)^2.$$

In this formula, meanings of the letters are as those described above.

Figure 12:
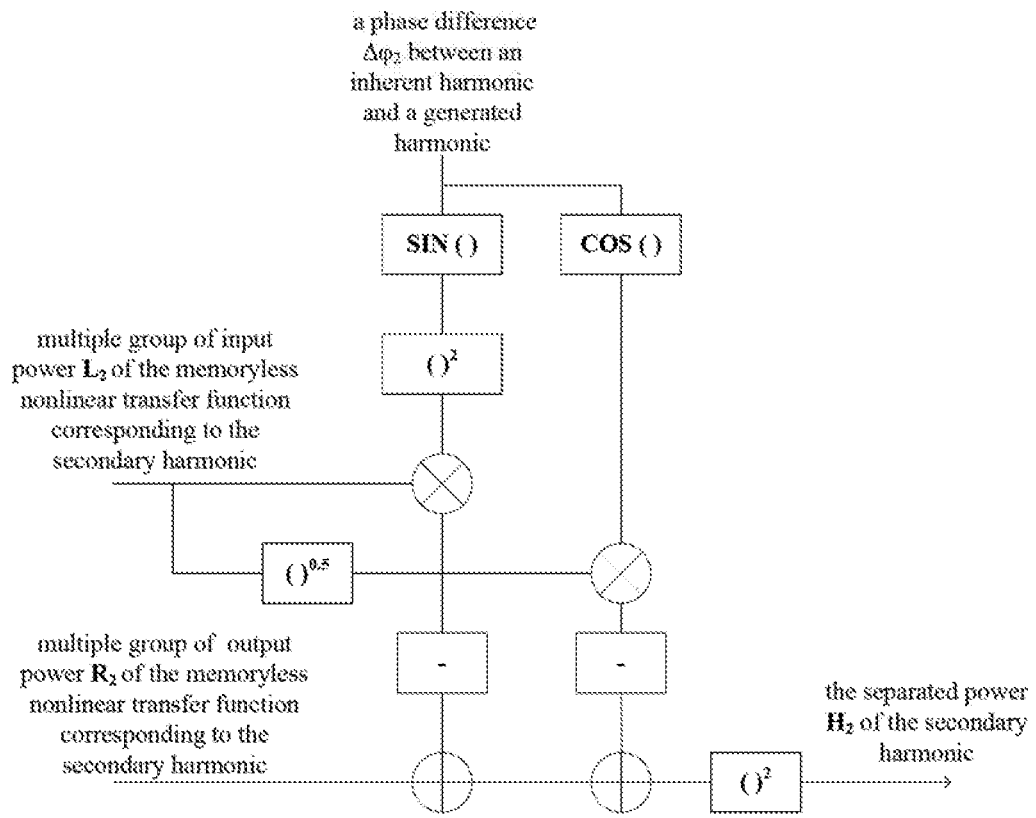
FIG. 12 is a schematic diagram of a hardware structure of the first separating module in the apparatus of FIG. 7.

FIG. 12 is a schematic diagram of a hardware structure of the first separating module 7021. However, this implementation is not limited thereto, and the implementation may be carried out via software.

In another implementation, as shown in FIG. 7, the determining unit 701 may further include a second determining module 7012, which is configured to determine a phase difference $\Delta\varphi_3$ between an inherent harmonic and a third harmonic by using the following formula:

$$\sqrt{R_3 - L_3\sin^2\Delta\varphi_3} - \sqrt{L_3}\cos\Delta\varphi_3 = \frac{\sqrt{2}}{8}|c_3|A^3;$$

where, $R_3$ is output power of the memoryless nonlinear transfer function corresponding to the third harmonic, $L_3$ is input power of the memoryless nonlinear transfer function corresponding to the third harmonic, $A$ is a fundamental magnitude, and $c_3$ is a coefficient of the nonlinear model corresponding to the third harmonic, which is assumed as being a constant.

Figure 13:
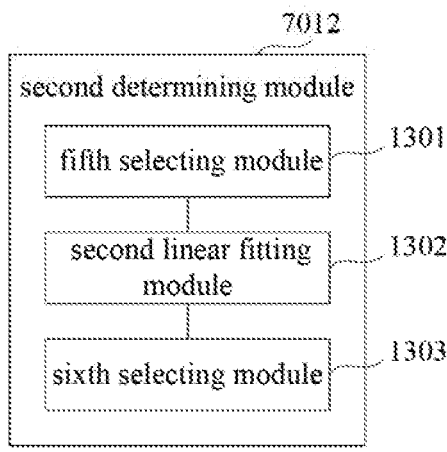
FIG. 13 is a schematic diagram of an implementation of the second determining module in the apparatus of FIG. 7.

In an implementation of the second determining module 7012, similar to the first implementation of the first determining module 7011, as shown in FIG. 13, the second determining module 7012 includes a fifth selecting module 1301, a second linear fitting module 1302 and a sixth selecting module 1303. The fifth selecting module 1301 selects multiple angles $\Delta\varphi_3$ from a range of 0-$2\pi$, with a selection method being not limited in this embodiment; the second linear fitting module 1302 performs linear fitting on $\sqrt{R_3-L_3\sin^2\Delta\varphi_3}-\sqrt{L_3}\cos\Delta\varphi_3$ and $$\frac{\sqrt{2}}{8}A^3$$

in the above formula by using each of $\Delta\varphi_3$; and the sixth selecting module 1303 selects a $\Delta\varphi_3$ making a fitting correlation coefficient maximum as the phase difference corresponding to the third harmonic.

Figure 14:
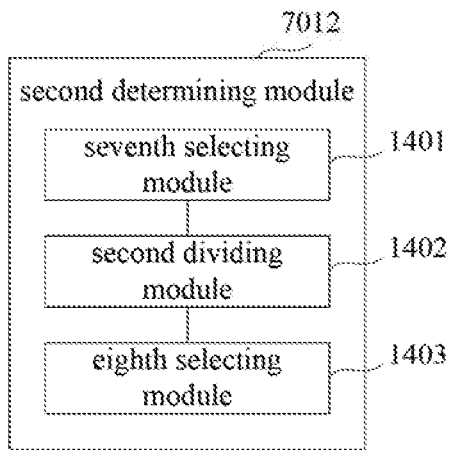
FIG. 14 is a schematic diagram of another implementation of the second determining module in the apparatus of FIG. 7.

In another implementation of the second determining module 7012, similar to the second implementation of the first determining module 7011, as shown in FIG. 14, the second determining module 7012 includes a seventh selecting module 1401, a second dividing module 1402 and an eighth selecting module 1403. The seventh selecting module 1401 selects multiple angles $\Delta\varphi_3$ from a range of 0-2π, with a selection method being not limited in this embodiment; the second dividing module 1402 performs division operations on $\sqrt{R_3 - L_3 \sin^2 \Delta\varphi_3} - \sqrt{L_3} \cos \Delta\varphi_3$ and $$\frac{\sqrt{2}}{8}A^3$$

by using each of $\Delta\varphi_3$; and the eighth selecting module 1403 selects a $\Delta\varphi_3$ making variance of quotients minimum as the phase difference corresponding to the third harmonic.

In this implementation, as shown in FIG. 7, the separating unit 702 further includes a second separating module 7022, which is configured to separate power $H_3$ of the third harmonic generated by the system to be measured by using the following formula:

$$H_3 = (\sqrt{R_3 - L_3 \sin^2 \Delta\varphi_3} - \sqrt{L_3} \cos \Delta\varphi_3)^3.$$

In this formula, meanings of the letters are as those described above.

In this implementation, hardware implementation of the second determining module 7012 and the second separating module 7022 is similar to the above implementation, which shall not be described herein any further.

With the apparatus of this embodiment, the power of the harmonic generated by the system to be measured may be separated, thereby making the nonlinear measurement relatively high in accuracy.

Embodiment 4

An embodiment of this disclosure further provides a nonlinear character determination apparatus, configured in a transmitter or a receiver or a communication system. As principles of the apparatus for solving problems are similar to that of the method in Embodiment 2, the implementation of the method in Embodiment 2 may be referred to for implementation of the apparatus, with identical contents being not going to be described herein any further.

Figure 15:
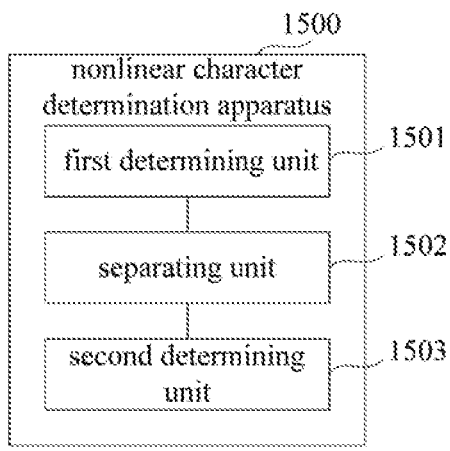
FIG. 15 is a schematic diagram of an implementation of the nonlinear character determination apparatus of the embodiment.

FIG. 15 is a schematic diagram of the apparatus. As shown in FIG. 15, the apparatus 1500 includes a first determining unit 1501, a separating unit 1502 and a second determining unit 1503.

In this embodiment, the first determining unit 1501 determines a phase difference between an inherent harmonic and a generated harmonic by using multiple groups of input power, output power and fundamental magnitudes of a memoryless nonlinear transfer function of a nonlinear model of a system to be measured; the separating unit 1502 separates power of a harmonic generated by the system to be measured by using the phase difference; and the second determining unit 1503 determines a nonlinear character of the system to be measured by using the separated power of the harmonic generated by the system to be measured.

In this embodiment, the first determining unit 1501 and the separating unit 1502 may respectively be implemented by the determining unit 701 and the separating unit 702 in Embodiment 3, the contents of which being incorporated herein, and being not going to be described herein any further.

With the apparatus of this embodiment, the measurement of the nonlinear character may be performed by using the separated power of the harmonic generated by the system to be measured, which is relatively high in accuracy.

Embodiment 5

Figure 16:
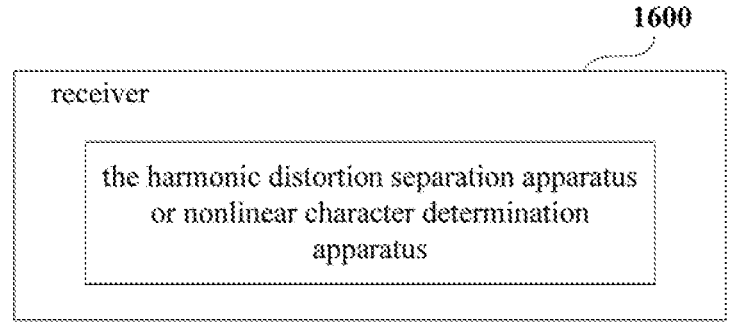
FIG. 16 is a schematic diagram of an implementation of the receiver of the embodiment.

An embodiment of this disclosure further provides a receiver. FIG. 16 is a schematic diagram of the receiver. As shown in FIG. 16, the receiver 1600 includes the harmonic distortion separation apparatus as described in Embodiment 3 or the nonlinear character determination apparatus as described in Embodiment 4. As the harmonic distortion separation apparatus 700 and the nonlinear character determination apparatus 1500 have been described in detail in Embodiment 3 and Embodiment 4, the contents of which being incorporated herein, and being not going to be described herein any further.

Figure 17:
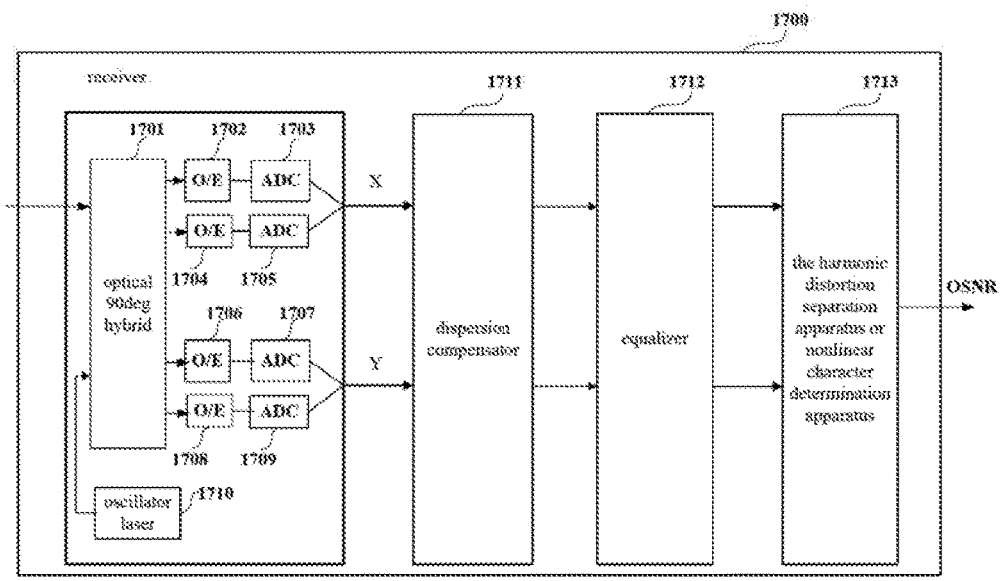
FIG. 17 is a schematic diagram of another implementation of the receiver of the embodiment.

FIG. 17 is a block diagram of a systematic structure of the receiver of the embodiment of this disclosure. As shown in FIG. 17, the receiver 1700 includes a front end configured to convert an inputted optical signal into baseband signals in two polarization states, the two polarization states including an H polarization state and a V polarization state in the embodiment of this disclosure.

As shown in FIG. 17, the front end includes an oscillator laser 1710, an optical 90 deg hybrid 1701, optoelectronic (O/E) detectors 1702, 1704, 1706 and 1708, analog-to-digital converters (ADCs) 1703, 1705, 1707 and 1709, a dispersion compensator 1711, an equalizer 1712 and a harmonic distortion separation apparatus or nonlinear character determination apparatus 1713. In this embodiment, a structure and functions of the harmonic distortion separation apparatus or nonlinear character determination apparatus 1713 are as those described in Embodiment 3 or 4, which shall not be described herein any further. The oscillator laser 1710 is configured to supply a local light source. An optical signal is converted into a baseband signal at a polarization state after passing through the optical 90 deg hybrid 1701, the optoelectronic (O/E) detectors 1702 and 1704, the analog-to-digital converters (ADCs) 1703 and 1705, and is converted into a baseband signal at another polarization state after passing through the optical 90 deg hybrid 1701, the optoelectronic (O/E) detectors 1706 and 1708, the analog-to-digital converters (ADCs) 1707 and 1709, with details being similar to the prior art, and being not going to be described herein any further.

Furthermore, if a frequency offset and a phase noise have effects on estimation of OSNR, the receiver 1700 may also include a frequency offset compensator and a phase noise compensator (not shown).

With the receiver of this embodiment, the power of the harmonic generated by the system to be measured may be separated, and the nonlinear measurement may be performed by using the power of the harmonic, which is relatively high in accuracy.

Embodiment 6

Figure 18:
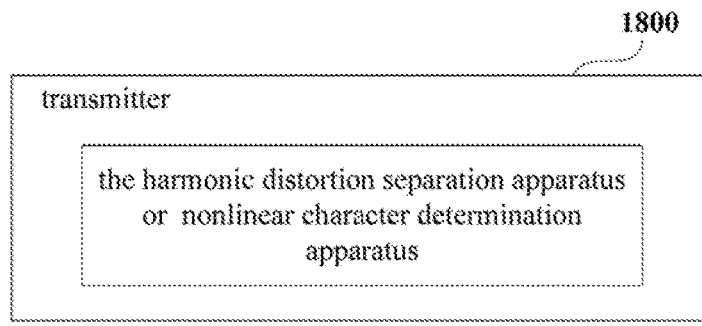
FIG. 18 is a schematic diagram of an implementation of the transmitter of the embodiment.

An embodiment of this disclosure further provides a transmitter. FIG. 18 is a schematic diagram of the transmitter. As shown in FIG. 18, the transmitter 1800 includes the harmonic distortion separation apparatus as described in Embodiment 3 or the nonlinear character determination apparatus as described in Embodiment 4. As the harmonic distortion separation apparatus 700 and the nonlinear character determination apparatus 1500 have been described in detail in Embodiment 3 and Embodiment 4, the contents of which being incorporated herein, and being not going to be described herein any further.

Figure 19:
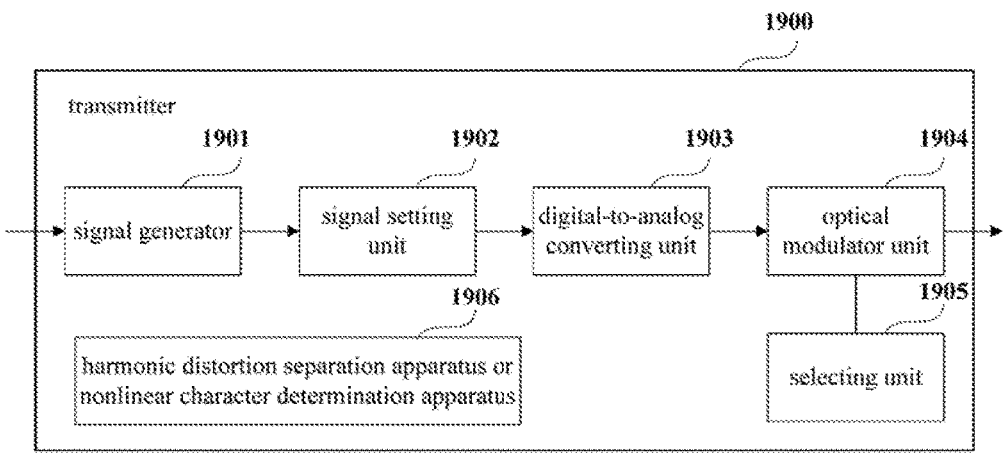
FIG. 19 is a schematic diagram of another implementation of the transmitter of the embodiment.

FIG. 19 is a block diagram of a systematic structure of the transmitter of the embodiment of this disclosure. As shown in FIG. 19, the transmitter 1900 includes a signal generator 1901, a signal setting unit 1902, a digital-to-analog converting unit 1903 and an optical modulator unit 1904; wherein, the signal generator 1901 generates digital signals according to transmission date, the signal setting unit 1902 sets pilot signals in the generated digital signals, the digital-to-analog converting unit 1903 performs digital-to-analog conversion on the digital signals, and the optical modulator unit 1904 modulates light by taking the signals converted by the digital-to-analog converting unit 1903 as modulation signals.

Furthermore, the transmitter may further include a selecting unit 1905, and the optical modulator unit 1904 performs signal modulation according to codewords selected by the selecting unit 1905, so that frequencies of pilot signals at different polarization states are different.

And the transmitter may further include a harmonic distortion separation apparatus or a nonlinear character determination apparatus 1906, which is configured to perform harmonic distortion separation or nonlinear character estimation on a system to be measured.

With the transmitter of this embodiment, the power of the harmonic generated by the system to be measured may be separated, and the nonlinear measurement may be performed by using the power of the harmonic, which is relatively high in accuracy.

Embodiment 7

Figure 20:
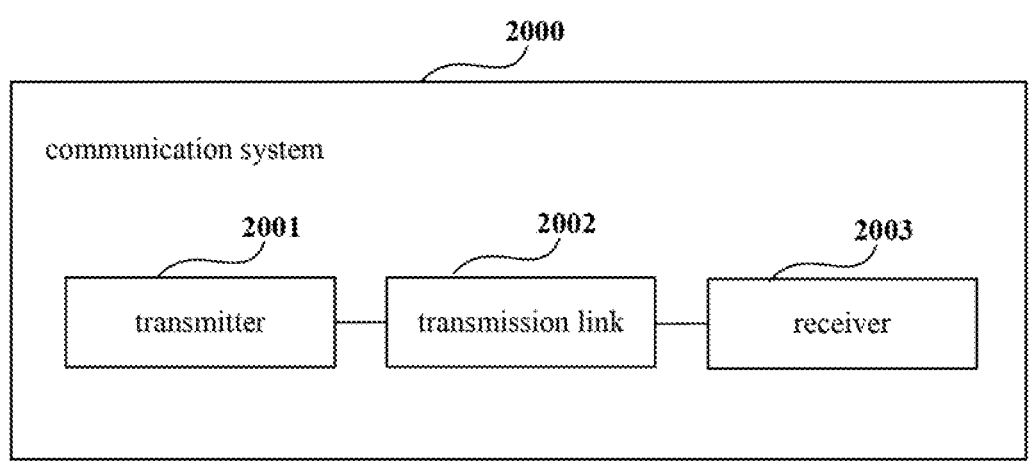
FIG. 20 is a schematic diagram of an implementation of the communication system of the embodiment.

An embodiment of this disclosure further provides a communication system. FIG. 20 is a schematic diagram of a structure of the communication system of this embodiment. As shown in FIG. 20, the communication system 2000 includes a transmitter 2001, a transmission link 2002 and a receiver 2003. In this embodiment, a structure and function of the transmitter 2001 are identical to those described in Embodiment 6, and a structure and function of the receiver 2003 are identical to those described in Embodiment 5, which shall not be described herein any further. The transmission link 2002 may have a structure and function in the prior art, and the structure and function of the transmission link are not limited in this embodiment of this disclosure.

With the communication system of this embodiment, the power of the harmonic generated by the system to be measured may be separated, and the nonlinear measurement may be performed by using the power of the harmonic, which is relatively high in accuracy.

An embodiment of this disclosure further provides a computer readable program code, which, when executed in a transmitter or a receiver or a communication system, will cause the transmitter or the receiver or the communication system to carry out the method as described in Embodiment 1 or 2.

An embodiment of the present disclosure provides a computer readable medium, including a computer readable program code, which will cause a transmitter or a receiver or a communication system to carry out the method as described in Embodiment 1 or 2.

The above apparatuses and methods of the present disclosure may be implemented by hardware, or by hardware in combination with software. The present disclosure relates to such a computer-readable program that when the program is executed by a logic device, the logic device is enabled to carry out the apparatus or components as described above, or to carry out the methods or steps as described above. The present disclosure also relates to a storage medium for storing the above program, such as a hard disk, a floppy disk, a CD, a DVD, and a flash memory, etc.

Accordingly, the harmonic distortion separation apparatus (or device) described herein may be implemented using hardware components, software components, and/or a combination thereof. For example, operations of the harmonic distortion separation apparatus may be implemented using one or more general-purpose or special purpose computers, such as, for example, a processor, a controller, etc., or any other device capable of responding to and executing instructions in a defined manner. Further, the harmonic distortion separation apparatus may include multiple processors or a single processor.

The present disclosure is described above with reference to particular embodiments. However, it should be understood by those skilled in the art that such a description is illustrative only, and not intended to limit the protection scope of the present disclosure. Various variants and modifications may be made by those skilled in the art according to the principles of the present disclosure, and such variants and modifications fall within the scope of the present disclosure.

For implementations of the present disclosure containing the above embodiments, following supplements are further disclosed.

Supplement 1. A harmonic distortion separation apparatus, configured in a transmitter or a receiver or a communication system, the apparatus including a determining unit configured to determine a phase difference between an inherent harmonic and a generated harmonic by using multiple groups of input power, output power and fundamental magnitudes of a memoryless nonlinear transfer function of a nonlinear model of a system to be measured; and a separating unit configured to separate power of a harmonic generated by the system to be measured by using the phase difference.

Supplement 2. The apparatus according to supplement 1, wherein the determining unit includes a first determining module configured to determine a phase difference $\Delta\varphi_2$ between an inherent harmonic and a generated harmonic corresponding to a secondary harmonic by using the following formula:

$$\sqrt{R_2 - L_2\sin^2\Delta\varphi_2} - \sqrt{L_2}\cos\Delta\varphi_3 = \frac{\sqrt{2}}{4}|c_2|A^2;$$

where, $R_2$ is output power of the memoryless nonlinear transfer function corresponding to the secondary harmonic, $L_2$ is input power of the memoryless nonlinear transfer function corresponding to the secondary harmonic, A is a fundamental magnitude, and $c_2$ is a coefficient of the nonlinear model corresponding to the secondary harmonic, which is assumed as being a constant.

Supplement 3. The apparatus according to supplement 2, wherein the first determining module includes a first selecting module configured to select multiple angles $\Delta\varphi_2$ from a range of 0-2π; a first linear fitting module configured to perform linear fitting on $\sqrt{R_2-L_2\sin^2\Delta\varphi_2}-\sqrt{L_2}\cos\Delta\varphi_2$ and $$\frac{\sqrt{2}}{4}A^2$$

in the above formula by using each of $\Delta\varphi_2$; and a second selecting module configured to select a $\Delta\varphi_2$ making a fitting correlation coefficient maximum as the phase difference corresponding to the secondary harmonic.

Supplement 4. The apparatus according to supplement 2, wherein the first determining module includes a third selecting module configured to select multiple angles $\Delta\varphi_2$ from a range of 0-2π; a first dividing module configured to perform division operations on $\sqrt{R_2-L_2\sin^2\Delta\varphi_2}-\sqrt{L_2}\cos\Delta\varphi_2$ and $$\frac{\sqrt{2}}{4}A^2$$

by using each of $\Delta\varphi_2$; and a fourth selecting module configured to select a $\Delta\varphi_2$ making variance of quotients minimum as the phase difference corresponding to the secondary harmonic.

Supplement 5. The apparatus according to supplement 2, wherein the separating unit includes a first separating module configured to separate power $H_2$ of the secondary harmonic generated by the system to be measured by using the following formula:

$$H_2=(\sqrt{R_2-L_2\sin^2\Delta\varphi_2}-\sqrt{L_2}\cos\Delta\varphi_2)^2.$$

Supplement 6. The apparatus according to supplement 1, wherein the determining unit includes a second determining module configured to determine a phase difference $\Delta\varphi_3$ between an inherent harmonic and a generated harmonic corresponding to a third harmonic by using the following formula:

$$\sqrt{R_3-L_3\sin^2\Delta\varphi_3}-\sqrt{L_3}\cos\Delta\varphi_3=\frac{\sqrt{2}}{8}|c_3|A^3;$$

where, $R_3$ is output power of the memoryless nonlinear transfer function corresponding to the third harmonic, $L_3$ is input power of the memoryless nonlinear transfer function corresponding to the third harmonic, A is a fundamental magnitude, and $c_3$ is a coefficient of the nonlinear model corresponding to the third harmonic, which is assumed as being a constant.

Supplement 7. The apparatus according to supplement 6, wherein the second determining module includes a fifth selecting module configured to select multiple angles $\Delta\varphi_3$ from a range of 0-2π; a second linear fitting module configured to perform linear fitting on $\sqrt{R_3-L_3\sin^2\Delta\Delta_3}-\sqrt{L_3}\cos\Delta\varphi_3$ and $$\frac{\sqrt{2}}{8}A^3$$

in the above formula by using each of $\Delta\varphi_3$; and a sixth selecting module configured to select a $\Delta\varphi_3$ making a fitting correlation coefficient maximum as the phase difference corresponding to the third harmonic.

Supplement 8. The apparatus according to supplement 6, wherein the second determining module includes a seventh selecting module configured to select multiple angles $\Delta\varphi_3$ from a range of 0-2π; a second dividing module configured to perform division operations on $\sqrt{R_3-L_3\sin^2\Delta\varphi_3}-\sqrt{L_3}\cos\Delta\varphi_3$ and $$\frac{\sqrt{2}}{8}A^3$$

by using each of $\Delta\varphi_3$; and an eighth selecting module configured to select a $\Delta\varphi_3$ making variance of quotients minimum as the phase difference corresponding to the third harmonic.

Supplement 9. The apparatus according to supplement 6, wherein the separating unit includes a second separating module configured to separate power $H_3$ of the third harmonic generated by the system to be measured by using the following formula:

$$H_3=(\sqrt{R_3-L_3\sin^2\Delta\varphi_3}-\sqrt{L_3}\cos\Delta\varphi_3)^3.$$

Supplement 10. A nonlinear character determination apparatus, configured in a transmitter or a receiver or a communication system, the apparatus including a first determining unit configured to determine a phase difference between an inherent harmonic and a generated harmonic by using multiple groups of input power, output power and fundamental magnitudes of a memoryless nonlinear transfer function of a nonlinear model of a system to be measured; a separating unit configured to separate power of a harmonic generated by the system to be measured by using the phase difference; and a second determining unit configured to determine a nonlinear character of the system to be measured by using the separated power of the harmonic generated by the system to be measured.

Supplement 11. A harmonic distortion separation method, including determining a phase difference between an inherent harmonic and a generated harmonic by using multiple groups of input power, output power and fundamental magnitudes of a memoryless nonlinear transfer function of a nonlinear model of a system to be measured; and separating power of a harmonic generated by the system to be measured by using the phase difference.

Supplement 12. The method according to supplement 11, wherein the determining a phase difference between an inherent harmonic and a generated harmonic includes determining a phase difference $\Delta\varphi_2$ between an inherent harmonic and a generated harmonic corresponding to a secondary harmonic by using the following formula:

$$\sqrt{R_2-L_2\sin^2\Delta\varphi_2}-\sqrt{L_2}\cos\Delta\varphi_2=\frac{\sqrt{2}}{4}|c_2|A^2;$$

where, $R_2$ is output power of the memoryless nonlinear transfer function corresponding to the secondary harmonic, $L_2$ is input power of the memoryless nonlinear transfer function corresponding to the secondary harmonic, A is a fundamental magnitude, and $c_2$ is a coefficient of the nonlinear model corresponding to the secondary harmonic, which is assumed as being a constant.

Supplement 13. The method according to supplement 12, wherein the determining a phase difference $\Delta\varphi_2$ between an inherent harmonic and a generated harmonic corresponding to a secondary harmonic includes selecting multiple angles $\Delta\varphi_2$ from a range of 0-2π; performing linear fitting on $$\sqrt{R_2 - L_2\sin^2\Delta\varphi_2} - \sqrt{L_2}\cos\Delta\varphi_2 \text{ and } \frac{\sqrt{2}}{4}A^2$$

in the above formula by using each of $\Delta\varphi_2$; and selecting a $\Delta\varphi_2$ making a fitting correlation coefficient maximum as the phase difference corresponding to the secondary harmonic.

Supplement 14. The method according to supplement 12, wherein the determining a phase difference $\Delta\varphi_2$ between an inherent harmonic and a generated harmonic corresponding to a secondary harmonic includes selecting multiple angles $\Delta\varphi_2$ from a range of 0-2π; performing division operations on $$\sqrt{R_2 - L_2\sin^2\Delta\varphi_2} - \sqrt{L_2}\cos\Delta\varphi_2 \text{ and } \frac{\sqrt{2}}{4}A^2$$

by using each of $\Delta\varphi_2$; and selecting a $\Delta\varphi_2$ making variance of quotients minimum as the phase difference corresponding to the secondary harmonic.

Supplement 15. The method according to supplement 12, wherein the separating power of a harmonic generated by the system to be measured by using the phase difference includes separating power $H_2$ of the secondary harmonic generated by the system to be measured by using the following formula:

$$H_2 = (\sqrt{R_2 - L_2\sin^2\Delta\varphi_2} - \sqrt{L_2}\cos\Delta\varphi_2)^2.$$

Supplement 16. The method according to supplement 11, wherein the determining a phase difference between an inherent harmonic and a generated harmonic includes determining a phase difference $\Delta\varphi_3$ between an inherent harmonic and a generated harmonic corresponding to a third harmonic by using the following formula:

$$\sqrt{R_3 - L_3\sin^2\Delta\varphi_3} - \sqrt{L_3}\cos\Delta\varphi_3 = \frac{\sqrt{2}}{8}|c_3|A^3;$$

where, $R_3$ is output power of the memoryless nonlinear transfer function corresponding to the third harmonic, $L_3$ is input power of the memoryless nonlinear transfer function corresponding to the third harmonic, A is a fundamental magnitude, and $c_3$ is a coefficient of the nonlinear model corresponding to the third harmonic, which is assumed as being a constant.

Supplement 17. The method according to supplement 16, wherein the determining a phase difference $\Delta\varphi_3$ between an inherent harmonic and a generated harmonic corresponding to a third harmonic includes selecting multiple angles $\Delta\varphi_3$ from a range of 0-2π;
performing linear fitting on $\sqrt{R_3 - L_3\sin^2\Delta\varphi_3} - \sqrt{L_3}\cos\Delta\varphi_3$ and $$\frac{\sqrt{2}}{8}A^3$$

in the above formula by using each of $\Delta\varphi_3$; and selecting a $\Delta\varphi_3$ making a fitting correlation coefficient maximum as the phase difference corresponding to the third harmonic.

Supplement 18. The method according to supplement 16, wherein the determining a phase difference $\Delta\varphi_3$ between an inherent harmonic and a generated harmonic corresponding to a third harmonic includes selecting multiple angles $\Delta\varphi_3$ from a range of 0-2π;
performing division operations on $\sqrt{R_3 - L_3\sin^2\Delta\varphi_3} - \sqrt{L_3}\cos\Delta\varphi_3$ and $$\frac{\sqrt{2}}{8}A^3$$

by using each of $\Delta\varphi_3$; and selecting a $\Delta\varphi_3$ making variance of quotients minimum as the phase difference corresponding to the third harmonic.

Supplement 19. The method according to supplement 16, wherein the separating power of a harmonic generated by the system to be measured by using the phase difference includes separating power $H_3$ of the third harmonic generated by the system to be measured by using the following formula:

$$H_3 = (\sqrt{R_3 - L_3\sin^2\Delta\varphi_3} - \sqrt{L_3}\cos\Delta\varphi_3)^3.$$

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A harmonic distortion separation apparatus included in a transmitter or a receiver or a communication system, or the communication system comprising the transmitter or the receiver, the apparatus comprising:
at least one hardware processor configured to:
transmit a test signal generated via a signal generator of the transmitter;
obtain, from the receiver, multiple powers corresponding to the test signal;
determine a phase difference between an inherent harmonic of the test signal and a generated harmonic of a test system for which nonlinear character is to be measured by using multiple groups of input power, output power and fundamental magnitudes of a memoryless nonlinear transfer function of a nonlinear model of the test system; and
separate power of a harmonic generated by the test system by using the phase difference,
wherein the at least one hardware processor is further configured to:
determine a phase difference $\Delta\varphi_2$ between the inherent harmonic of the test signal and the generated harmonic of the test system corresponding to a secondary harmonic by using the following formula:

$$\sqrt{R_2 - L_3\sin^2\Delta\varphi_2} - \sqrt{L_2}\cos\Delta\varphi_2 = \frac{\sqrt{2}}{4}|c_2|A^2;$$

where, $R_2$ is output power of the memoryless nonlinear transfer function corresponding to the secondary harmonic, $L_2$ is input power of the memoryless nonlinear transfer function corresponding to the secondary harmonic, A is a fundamental magnitude, and $c_2$ is a coefficient of the nonlinear model corresponding to the secondary harmonic, which is a constant, thereby, increasing accuracy of measuring the nonlinear character and improving performance of the test system.

2. The harmonic distortion separation apparatus according to claim 1, wherein the at least one hardware processor is configured to:
select multiple angles $\Delta\varphi_2$ from a range of $0$-$2\pi$;
perform linear fitting on $\sqrt{R_2-L_2\sin^2\Delta\varphi_2}-\sqrt{L_2}\cos\Delta\varphi_2$ and $$\frac{\sqrt{2}}{4}A^2$$

in the above formula by using each of $\Delta\varphi_2$; and
select a $\Delta\varphi_2$ making a fitting correlation coefficient maximum as the phase difference corresponding to the secondary harmonic.

3. The harmonic distortion separation apparatus according to claim 1, wherein the at least one hardware processor is configured to:
select multiple angles $\Delta\varphi_2$ from a range of $0$-$2\pi$;
perform division operations on $\sqrt{R_2-L_2\sin^2\Delta\varphi_2}-\sqrt{L_2}\cos\Delta\varphi_2$ and $$\frac{\sqrt{2}}{4}A^2$$

by using each of $\Delta\varphi_2$; and
select a $\Delta\varphi_2$ making variance of quotients minimum as the phase difference corresponding to the secondary harmonic.

4. The harmonic distortion separation apparatus according to claim 1, wherein the at least one hardware processor is configured to:
separate power $H_2$ of the secondary harmonic generated by the test system by using the following formula:

$$H_2=(\sqrt{R_2-L_2\sin^2\Delta\varphi_2}-\sqrt{L_2}\cos\Delta\varphi_2)^2.$$

5. A harmonic distortion separation apparatus is included in a transmitter or a receiver or a communication system, the communication system comprises the transmitter and the receiver, the apparatus comprising:
at least one hardware processor configured to:
transmit a test signal generated via a signal generator of the transmitter;
obtain, from the receiver, multiple powers corresponding to the test signal;
determine a phase difference between an inherent harmonic of the test signal and a generated harmonic of a test system for which nonlinear character is to be measured by using multiple groups of input power, output power and fundamental magnitudes of a memoryless nonlinear transfer function of a nonlinear model of the test system to be measured; and
separate power of a harmonic generated by the test system by using the phase difference,
wherein the at least one hardware processor further is configured to:
determine a phase difference $\Delta\varphi_3$ between the inherent harmonic of the test signal and the generated harmonic of the test system corresponding to a third harmonic by using the following formula:

$$\sqrt{R_3-L_3\sin^2\Delta\varphi_3}-\sqrt{L_3}\cos\Delta\varphi_3=\frac{\sqrt{2}}{8}|c_3|A^3;$$

where, $R_3$ is output power of the memoryless nonlinear transfer function corresponding to the third harmonic, $L_3$ is input power of the memoryless nonlinear transfer function corresponding to the third harmonic, A is a fundamental magnitude, and $c_3$ is a coefficient of the nonlinear model corresponding to the third harmonic, which is a constant, thereby, increasing accuracy of measuring the nonlinear character and improving performance of the test system.

6. The harmonic distortion separation apparatus according to claim 5, wherein the at least one hardware processor is configured to:
select multiple angles $\Delta\varphi_3$ from a range of $0$-$2\pi$;
perform linear fitting on $\sqrt{R_3-L_3\sin^2\Delta\varphi_3}-\sqrt{L_3}\cos\Delta\varphi_3$ and $$\frac{\sqrt{2}}{8}A^3$$

in the above formula by using each of $\Delta\varphi_3$; and
select a $\Delta\varphi_3$ making a fitting correlation coefficient maximum as the phase difference corresponding to the third harmonic.

7. The harmonic distortion separation apparatus according to claim 5, wherein the at least one hardware processor is configured to:
select multiple angles $\Delta\varphi_3$ from a range of $0$-$2\pi$;
perform division operations on $\sqrt{R_3-L_3\sin^2\Delta\varphi_3}-\sqrt{L_3}\cos\Delta\varphi_3$ and $$\frac{\sqrt{2}}{8}A^3$$

by using each of $\Delta\varphi_3$; and
select a $\Delta\varphi_3$ making variance of quotients minimum as the phase difference corresponding to the third harmonic.

8. The harmonic distortion separation apparatus according to claim 5, wherein the at least one hardware processor is configured to:
separate power $H_3$ of the third harmonic generated by the test system by using the following formula:

$$H_3=(\sqrt{R_3-L_3\sin^2\Delta\varphi_3}-\sqrt{L_3}\cos\Delta\varphi_3)^2.$$

9. A method for a harmonic distortion separation apparatus, the apparatus is included in a transmitter or a receiver or a communication system, the communication system comprises the transmitter and the receiver, the method, including:
transmitting a test signal generated via a signal generator of the transmitter;
obtaining, from the receiver, multiple powers corresponding to the test signal;
determining, by at least one hardware processor, a phase difference between an inherent harmonic of the test signal and a generated harmonic of a test system for which nonlinear character is to be measured by using multiple groups of input power, output power and fundamental magnitudes of a memoryless nonlinear transfer function of a nonlinear model of the test system to be measured; and separating, by the at least one hardware processor, power of a harmonic generated by the test system by using the phase difference, wherein the determining a phase difference between an inherent harmonic and a generated harmonic includes:

determining a phase difference $\Delta\varphi_2$ between the inherent harmonic of the test signal and the generated harmonic of the test system corresponding to a secondary harmonic by using the following formula:

$$\sqrt{R_2 - L_2\sin^2\Delta\varphi_2} - \sqrt{L_2}\cos\Delta\varphi_2 = \frac{\sqrt{2}}{4}|c_2|A^2;$$

where, $R_2$ is output power of the memoryless nonlinear transfer function corresponding to the secondary harmonic, $L_2$ is input power of the memoryless nonlinear transfer function corresponding to the secondary harmonic, A is a fundamental magnitude, and $c_2$ is a coefficient of the nonlinear model corresponding to the secondary harmonic, which is a constant, thereby, increasing accuracy of measuring the nonlinear character and improving performance of the test system.

10. The method for the harmonic distortion separation apparatus according to claim 9, wherein the determining a phase difference $\Delta\varphi_2$ between an inherent harmonic and a generated harmonic corresponding to a secondary harmonic includes:

selecting multiple angles $\Delta\varphi_2$ from a range of 0-2n;
performing linear fitting on $\sqrt{R_2-L_2\sin^2\Delta\varphi_2}-\sqrt{L_2}\cos\Delta\varphi_2$ and $$\frac{\sqrt{2}}{4}A^2$$

in the above formula by using each of $\Delta\varphi_2$; and
selecting a $\Delta\varphi_2$ making a fitting correlation coefficient maximum as the phase difference corresponding to the secondary harmonic.

11. The method for the harmonic distortion separation apparatus according to claim 9, wherein the determining a phase difference $\Delta\varphi_2$ between an inherent harmonic and a generated harmonic corresponding to a secondary harmonic includes:

selecting multiple angles $\Delta\varphi_2$ from a range of 0-2n;
performing division operations on $\sqrt{R_2-L_2\sin^2\Delta\varphi_2}-\sqrt{L_2}\cos\Delta\varphi_2$ and $$\frac{\sqrt{2}}{4}A^2$$

by using each of $\Delta\varphi_2$; and
selecting a $\Delta\varphi_2$ making variance of quotients minimum as the phase difference corresponding to the secondary harmonic.

12. The method for the harmonic distortion separation apparatus according to claim 9, wherein the separating power of a harmonic generated by the test system by using the phase difference includes:

separating power $H_2$ of the secondary harmonic generated by the test system by using the following formula:

$$H_2 = (\sqrt{R_2-L_2\sin^2\Delta\varphi_2}-\sqrt{L_2}\cos\Delta\varphi_2)^2.$$

13. A method for a harmonic distortion separation apparatus, the apparatus is included in a transmitter or a receiver or a communication system, the communication system comprises the transmitter and the receiver, the method, including:

transmitting a test signal generated via a signal generator of the transmitter;
obtaining, from the receiver, multiple powers corresponding to the test signal;
determining, by one or more processors, a phase difference between an inherent harmonic of the test signal and a generated harmonic of a test system for which nonlinear character is to be measured by using multiple groups of input power, output power and fundamental magnitudes of a memoryless nonlinear transfer function of a nonlinear model of the test system to be measured; and
separating, by the one or more processors, power of a harmonic generated by the test system by using the phase difference,
wherein the determining a phase difference between an inherent harmonic and a generated harmonic includes:
determining a phase difference $\Delta\varphi_3$ between the inherent harmonic of the test signal and the generated harmonic of the test corresponding to a third harmonic by using the following formula:

$$\sqrt{R_3 - L_3\sin^2\Delta\varphi_3} - \sqrt{L_3}\cos\Delta\varphi_3 = \frac{\sqrt{2}}{8}|c_3|A^3;$$

where, $R_3$ is output power of the memoryless nonlinear transfer function corresponding to the third harmonic, $L_3$ is input power of the memoryless nonlinear transfer function corresponding to the third harmonic, A is a fundamental magnitude, and $c_3$ is a coefficient of the nonlinear model corresponding to the third harmonic, which is a constant, thereby, increasing accuracy of measuring the nonlinear character and improving performance of the test system.

14. The method for the harmonic distortion separation apparatus according to claim 13, wherein the determining a phase difference $\Delta\varphi_3$ between an inherent harmonic and a generated harmonic corresponding to a third harmonic includes:

selecting multiple angles $\Delta\varphi_3$ from a range of 0-2π;
performing linear fitting on $\sqrt{R_3-L_3\sin^2\Delta\varphi_3}-\sqrt{L_3}\cos\Delta\varphi_3$ and $$\frac{\sqrt{2}}{8}A^3$$

in the above formula by using each of $\Delta\varphi_3$; and
selecting a $\Delta\varphi_3$ making a fitting correlation coefficient maximum as the phase difference corresponding to the third harmonic.

15. The method for the harmonic distortion separation apparatus according to claim 13, wherein the determining a phase difference $\Delta\varphi_3$ between an inherent harmonic and a generated harmonic corresponding to a third harmonic includes:

selecting multiple angles $\Delta\varphi_3$ from a range of 0-2π;

performing division operations on $\sqrt{R_3-L_3\sin^2\Delta\varphi_3}-\sqrt{L_3}\cos\Delta\varphi_3$ and $$\frac{\sqrt{2}}{8}A^3$$

by using each of $\Delta\varphi_3$; and selecting a $\Delta\varphi_3$ making variance of quotients minimum as the phase difference corresponding to the third harmonic.

16. The method for the harmonic distortion separation apparatus according to claim 13, wherein the separating power of a harmonic generated by the test system by using the phase difference includes:

separating power $H_3$ of the third harmonic generated by the test system by using the following formula:

$$H_3=(\sqrt{R_3-L_3\sin^2\Delta\varphi_3}-\sqrt{L_3}\cos\Delta\varphi_3)^2.$$

* * * * *